(12) United States Patent
Fainzilber et al.

(10) Patent No.: US 10,879,940 B2
(45) Date of Patent: Dec. 29, 2020

(54) DECODING WITH DATA MAPPING METHODS AND SYSTEMS

(71) Applicant: Western Digital Technologies, Inc., San Jose, CA (US)

(72) Inventors: Omer Fainzilber, San Jose, CA (US); Dudy Avraham, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/407,671

(22) Filed: May 9, 2019

(65) Prior Publication Data

US 2020/0358458 A1    Nov. 12, 2020

(51) Int. Cl.
*H03M 13/45* (2006.01)
*G11C 29/52* (2006.01)
*G06F 11/10* (2006.01)

(52) U.S. Cl.
CPC ......... *H03M 13/45* (2013.01); *G06F 11/1068* (2013.01); *G11C 29/52* (2013.01)

(58) Field of Classification Search
CPC ..... H03M 13/45; G06F 11/1068; G11C 29/52
See application file for complete search history.

(56) References Cited

U.S. PATENT DOCUMENTS

| | | | | |
|---|---|---|---|---|
| 7,865,802 B1* | 1/2011 | Feng | ..................... | H03M 5/145 |
| | | | | 341/59 |
| 2010/0306619 A1* | 12/2010 | Yang | ................... | G06F 11/1072 |
| | | | | 714/758 |
| 2012/0297271 A1* | 11/2012 | Sommer | ............. | G06F 11/1048 |
| | | | | 714/766 |

* cited by examiner

*Primary Examiner* — Thien Nguyen
(74) *Attorney, Agent, or Firm* — Dickinson Wright PLLC; Steven Hurles

(57) ABSTRACT

A method for improving decoding and error correction in non-volatile memory, e.g., solid state drives. A map is generated for each data type that has a structure, e.g., text files. The map can be based on the underlying characteristics of this type of the data file and the mutual information between $L_{out}$ to a soft decoder. The map transforms the data prior to encoding to condition the data to improve decoding and error correction.

19 Claims, 10 Drawing Sheets

BYTES OF A TEXT FILE IN ASCII FORMAT

DECODING WITH DATA MAPPING METHODS AND SYSTEMS

TECHNICAL FIELD

This disclosure relates to memory systems, and in particular, to methods and systems for data mapping for decoding data in the memory system.

BACKGROUND

Reliability of solid state drives (SSDs) is a factor that distinguishes these drives from other conventional memory arrangements. Such SSDs are required to have long term endurance and memory capabilities, especially at end of the drive service life. In order to achieve the high reliability for a SSD, the data stored on the SSD is protected such that it may be recovered, in case of a malfunction. The recovery systems may vary, but one of the most typical is a protection using an Error Code Correction (ECC) code. Most often, ECC codes include low density parity check codes (LDPC) that are used with soft decoders. Soft ECC decoders may use default parameters which may correspond to a case of uniform distribution of data. Such conventional decoder approaches, however, have many disadvantages including a high number of bit flips that may lead to wrong estimation of underlying statistics. Decoding latency may increase and power consumption may also increase based upon inaccurate decoding. There is a need to provide a cost efficient method and apparatus that may decode data using existing data and underlying statistics to safeguard against data loss.

SUMMARY

This disclosure relates generally to memory management systems and methods. An aspect of the disclosed embodiments is a method for decoding data in a memory, which may include receiving from a non-volatile memory a data file, which is stored via one-to-one mapping; decoding the data set with a soft decoder; de-mapping the decoded data set that was subject to one-to-one mapping of the decoded data file; and outputting the de-mapped data file.

In an aspect of the disclosure, a method can include reversing a transformation of the data file that was mapped based on inherent redundancy of a data type in the data set.

In an aspect of the disclosure, a method can include de-mapping reversing the decoded data file according to a probability of a data value to occur in the data type.

In an aspect of the disclosure, a method can include sending learned information (L_in) from a soft decoder to a content aware module, and sending information (L_out) from the content aware module to the soft decoder.

In an aspect of the disclosure, decoding can includes processing L_in and additional properties of the data file to produce $L_{out}$, wherein the additional properties can input from an offline source, can be learned from a current estimation of the bits from the soft decoder.

In an aspect of the disclosure, a method can include one-to-one mapping not reducing the size of the data file.

An aspect of the disclosure can include one-to-one mapping is based on a structure of the data file that is common to all data files of a same type.

In an aspect of the disclosure, a method can include mapping a data file to produce a mapped data file using a one-to-one data map for the type of data in the data file; encoding the mapped data file to produce an encoded data file; storing the encoded data file in a non-volatile memory; reading the encoded data file; decoding the encoded data set with error correction; and de-mapping the data to reproduce the data file.

In an aspect of the disclosure, the one-to-one data map is selected to change the data file to improve error correction of the decoding the encoded data set.

In an aspect of the disclosure, a method can include using an encoding scheme that usies the mapped data file improves mutual information of a content aware module's output (L_out) and the new data after the mapping (_Z).

An aspect of the disclosure, which can be combined with any aspect of the disclosure, includes the data file being a non-uniformly distributed file, wherein the map is formed by performing in a processor, drawing data according to distribution of a temporary underlying statistics as the data file with noise representing probable noise in the memory system, calculating an input Lout to decoding using the noised data and feedback from a content aware module; calculating mutual information between Lout and the data file before noise; choosing a highest mutual information between Lout and the data file before noise; and setting a map to be used with a data file equal to a map with the highest mutual information.

An aspect of the disclosure, which can be combined with any aspect of the disclosure, includes the data file being a text file. The map is formed by performing in a processor: drawing data according to distribution of the temporary underlying statistics of as the data file with noise representing probable noise in the memory system; calculating an input Lout to decoding using the noised data and feedback from a content aware module; calculating mutual information between Lout and the data file before noise; choosing a highest mutual information between Lout and the data file before noise; and setting a map to be used with a data file equal to a map with the highest mutual information.

An aspect of the disclosure, which can be combined with any aspect of the disclosure, includes performing mapping when the data file has a structure and skipping mapping when the data file does not have a structure, wherein skipping mapping still allows for encoding the mapped data file to produce an encoded data file; storing the encoded data file in a non-volatile memory; reading the encoded data file; decoding the encoded data set with error correction using a content aware module and a soft decoder.

An aspect of the disclosure a memory controller for nonvolatile memory, includes: a controller memory to store a plurality of data maps; and a processor operatively coupled with the controller memory and configured to determine a data type of a data set to be stored in nonvolatile memory, select a data map from the plurality of data maps, map the data set to produce a mapped data set, encode the mapped data set, and store the encoded data set in the nonvolatile memory.

An aspect of the disclosure, which can be combined with any aspect of the disclosure, the processor is further configured to map the data set bijection.

An aspect of the disclosure, which can be combined with any aspect of the disclosure, the processor is further configured to: read the data set from the nonvolatile memory, decode the data set using an iterative content aware module to produce a decoded data set, and de-map the data set using the map to produce the data set.

An aspect of the disclosure, which can be combined with any aspect of the disclosure, the processor is further configured to feedback data characteristics learned from a soft decoder back to a content aware module that processes historical data characteristics for the data type and the feedback data characteristics.

An aspect of the disclosure, which can be combined with any aspect of the disclosure, the map does not compress data set.

An aspect of the disclosure, which can be combined with any aspect of the disclosure, each of the plurality of data maps are data tables that transform each input byte in the data set to an output byte in the mapped data set.

An aspect of the disclosure, which can be combined with any aspect of the disclosure, the processor is further configured to store in memory the data type for each data set stored in the nonvolatile memory to select the same map to de-map the decoded data set.

These and other aspects of the present disclosure are disclosed in the following detailed description of the embodiments, the appended claims, and the accompanying figures.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

DETAILED DESCRIPTION

Figure 1:
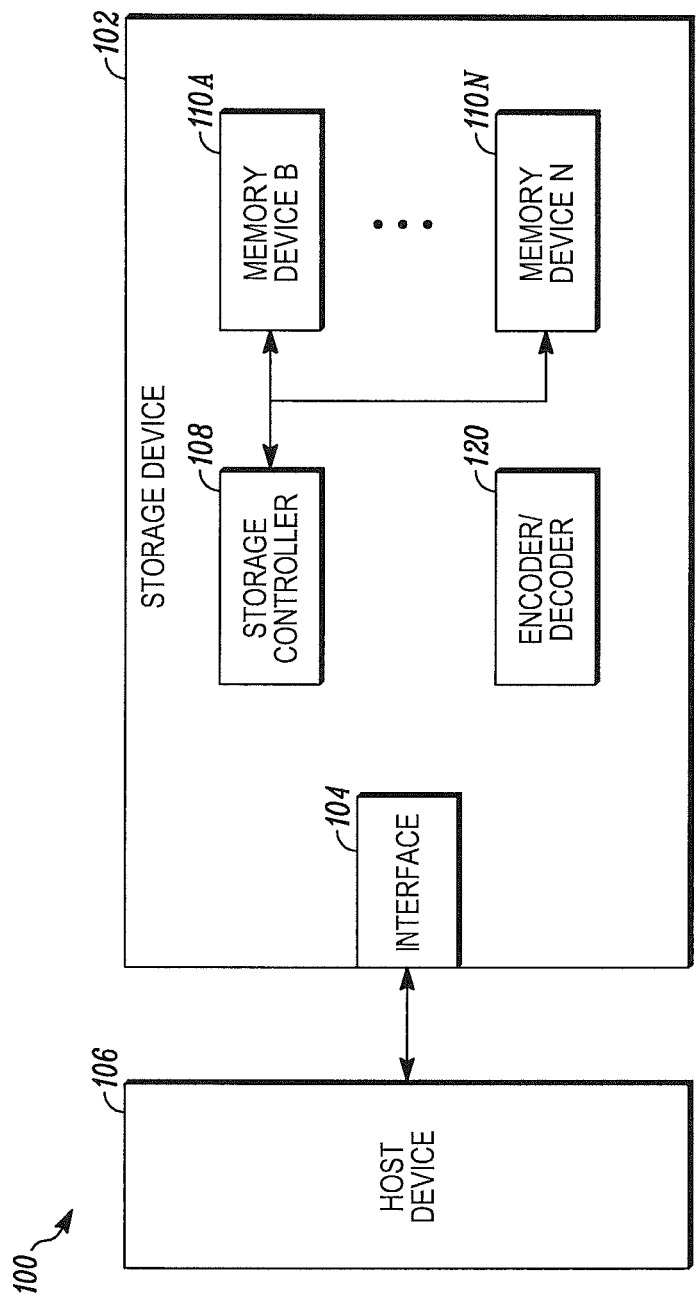
FIG. 1 generally illustrates a block diagram of an example memory system.

FIG. 1 generally illustrates a electronic memory arrangement 100 including a host device 106 and a storage device 102. Data may be sent and received through an interface 104 between the host device 106 and the storage device 102. The interface 104 is configured to interface with the host device 106, e.g., to communicate data and/or command requests as provided by the host device 106 for processing by the storage device 102. An encoder/decoder 120 is present in the storage device 102 for encoding/decoding data as needed. A storage controller 108 is provided in the storage device 102 to control either a single memory device 110A or multiple memory devices 110N. In the illustrated embodiments, the storage device 102 may be a single or a number of solid state storage devices (SSDs) for storage of data.

Aspects of the disclosure use the elements/components described in FIG. 1 to enable execution of several methods to utilize data using an encoder/decoder, which will lead to an increase in the correction capability and reduction in the decoding latency and power consumption. These methods will cause data to be read with a higher accuracy compared to conventional methods. The aspects of the disclosure may use structure, found in the data itself, to enable more consistent decoding. The structure of the data itself is used to create a map, e.g., a one-to-one map, for the type of data.

In aspects described herein, data is processed or scanned to develop a one-to-one mapping of the data. This development of mapping can be based on the data type. The data mapping can be developed offline for a plurality of different data types. Each data type can have its own map. The mapping for a data type can be stored in the memory of the controller that performs the encoding and decoding. Using the mapping can increase the correction capability and reduce the decoding latency and power consumption of the decoder. The method applies a mapping transformation on the data set prior the encoding such that the encoded data is more robust to noise. As a result, the decoder will be capable to decode larger number of bit flips.

In many cases, data written to flash memory, such as NAND-based SSDs, has structure to it. The memory devices 110A-110N may be based on flash memory (NAND) technology. The structure of the data can be a property of a user source (e.g. if the saved data is textual in origin). In other embodiments, the structure can be a property of the way the NAND is used (e.g. tables written by the firmware, data padded with zeros etc.). In either case, finding such structures and considering the structures in the decoding process can yield significantly higher correction capability than attempting to perform error correction without using such structure.

Aspects of the disclosure describe a set of content aware methods, with mapped data, to decode data read from the non-volatile memory, e.g., a NAND. In the methods described, the data is used to determine structure or patterns that are within the data, which eventually provide better decoding abilities. The structure or patterns in the data can be used to develop a map to transform the data before encoding to improve decoding/error correction of the data when read from memory, provide feedback information while the memory is in use in the field to the decoder, or both.

Figure 2:
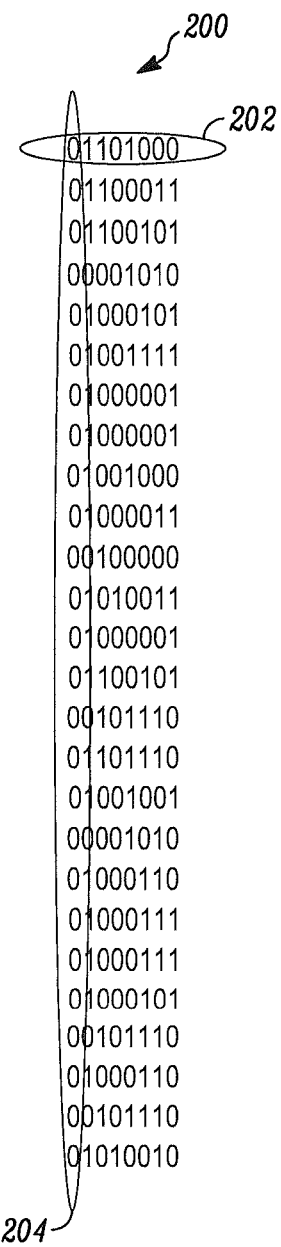
FIG. 2 is a graph of data bytes of a text file in ASCII format in an aspect of the present disclosure.

FIG. 2 shows a data set 200, which can be a text data file, with the most significant bit 204 in each byte is always zero. Thus, in the general case, sometimes there is a gain in decoding accuracy by dividing the data to be evaluated into portions smaller than the whole and obtain statistics regarding positioning bits according to their position within the smaller data portions or chunks and the repeating nature of some bits, bytes data portions, or combinations thereof. The fact that the data elements start with a leading zero can be used to develop a map to transform this type of data file or can also be fed to the decoder from a content aware module or be used to transform. As can be seen in the data set, some of the smaller portions of repeat in the file. The repeating portions of the bytes can be used to develop a map to transform data sets as described herein.

In one embodiment, the data is divided into data chunks of size K, then the underlying statistics of the distribution of the K-tuples is calculated by counting the number of occurrences of each K-tuple within the data.

For the example presented in FIG. 2, K is equal to 8 (for dividing the data into bytes) and the high probability byes correspond to alpha-numeric characters as expected in a text file. This can be used to statistically analyze a data file that corresponds to a text file, which is explained with regard to FIG. 3.

The learning of the statistics can be done in global manner for the entire amount of data or on the basis of multiple data files for a same type of data, e.g., a text file, a video file, an image file, a music file, etc. Additional approaches can divide the data into different regions and for each region, the statistics will be learned locally. The learned statistics will yield information about a file type that can be used to develop a map to transform the data prior to encoding to improve the decoding, e.g., error correction, of the data set from the memory. This learned data can be used in the decoder for decoding the data or used to develop the map to transform the data prior to encoding and storage. The map is chosen to transform the data set to a form that improves the performance of the decoder during decoding of the data set.

Figure 3:
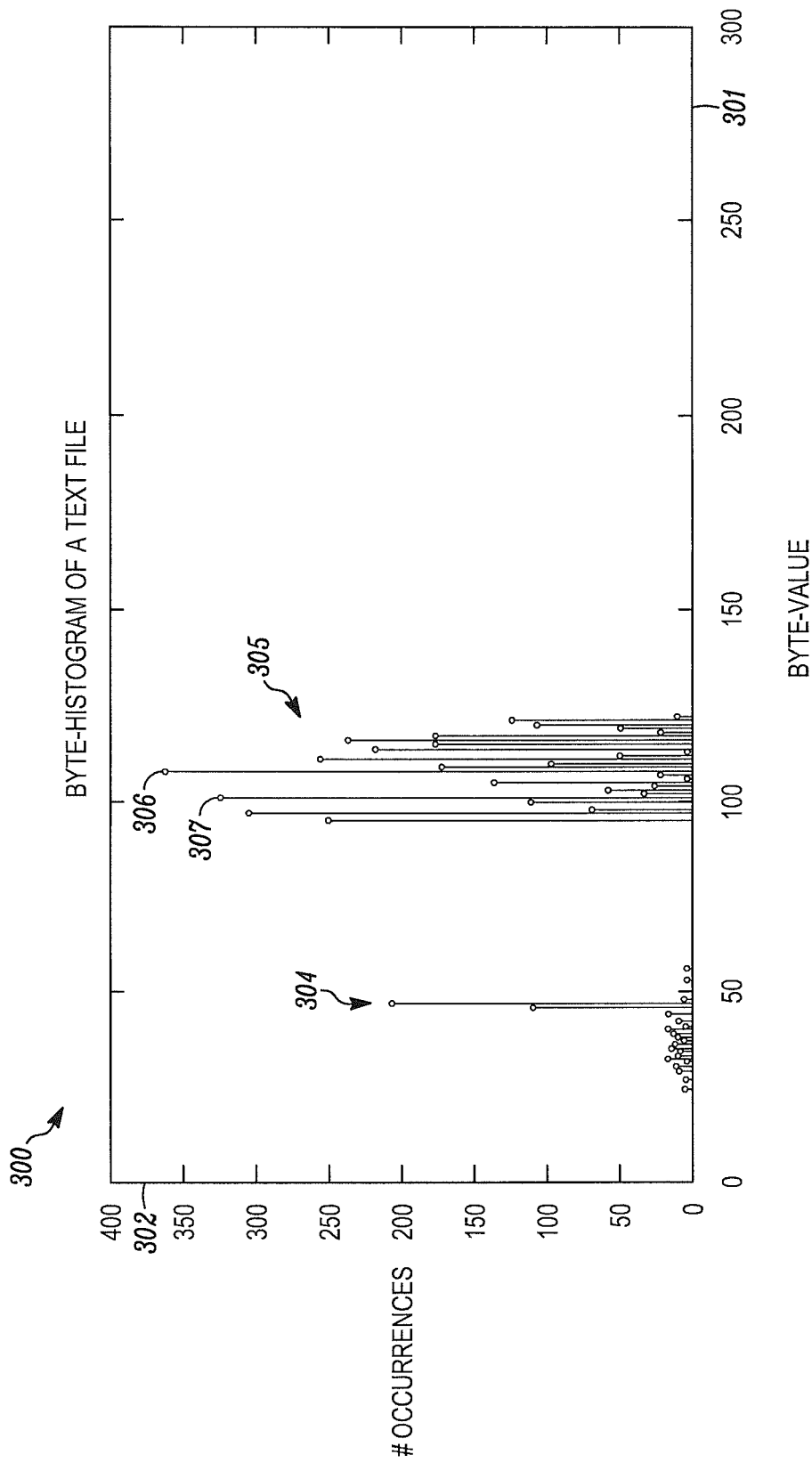
FIG. 3 is a byte histogram of a text file in an aspect of the present disclosure.

FIG. 3 is a histogram 300 of a data file, here, a text file. The abscissa 301 indicates byte-value representing a byte of data in the text file. Here, the bytes in the text file are assigned a unique value between zero and two hundred fifty six (2N, where N is 8) representing individual bytes. The ordinate 302 indicates the number of occurrences of each byte-value in the data file. The histogram 300 shows the occurrences of the bytes in the text file. The text file has certain groupings 304, 305 of byte-values that occur significantly more often than other byte-values or other groupings of byte-values. The first grouping 304 shows byte-values between about twenty-five and sixty that exceed zero or one occurrences with two byte-values exceeding one hundred occurrences. The second grouping 305 shows byte-values between about ninety and one-hundred twenty-five that exceed ten occurrences with a multiplicity that exceed one hundred occurrences. These two groupings 304, 305 store the most information in the text file and if stored in memory together may be susceptible to noise or other errors in the storage of the data file or in decoding the data file. The top two, most occurring byte-values are at 306, 307 in the grouping 305.

The histogram 300 shows the inherent redundancy in a text data file. The text data file has a structure, here, shown as byte occurrence. For example, most of the information is in repeated bytes in the groupings 304, 305. An aspect of the present disclosure will define the properties of the data file that are tracked for that data type. For example, in text files, it is easier to think of the data as a collection of characters, where each character is represented by eight bits. For example, the encoder/decoder can incorporate these data properties during a decoding operation. An example of such a decoder is called the Iterative Content Aware Decoder (ICAD) and is described in further detail with regard to FIG. 5 below.

Figure 4:
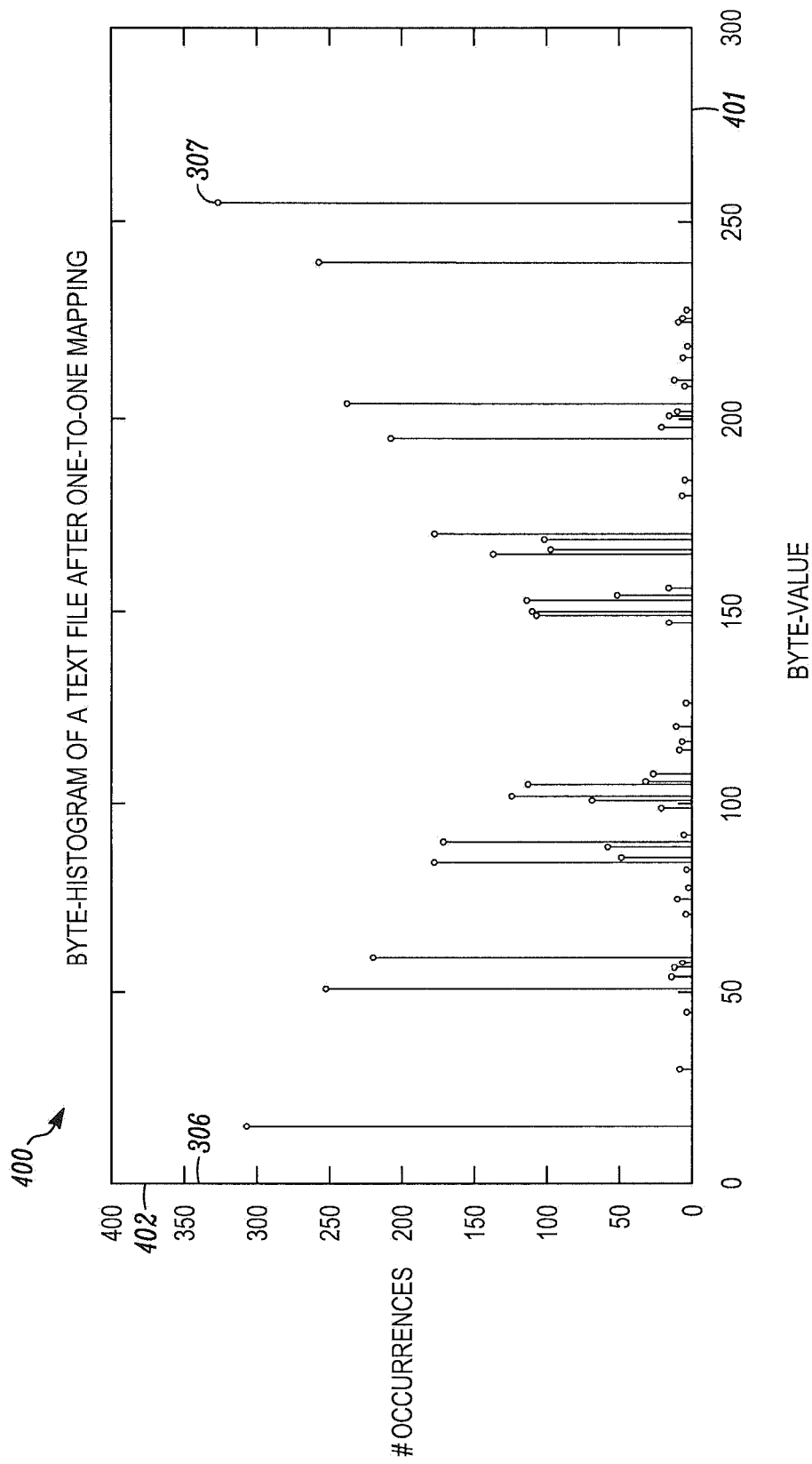
FIG. 4 is a schematic view of a decoding scheme for a memory system in an aspect of the present disclosure.

FIG. 4 shows histogram 400 of the same data file of FIG. 3, but after the data file has been mapped according to the teachings herein. That is the histogram 400 shows a mapped data file. The abscissa 401 indicates byte-values representing a byte of data in the data file. The ordinate 402 indicates the number of occurrences of each byte-value in the data file. The byte-values of histogram 300 have been mapped to new locations as shown in histogram 400. For example, the top two byte-values 306, 307 in histogram 300 are separated from each other and are now located essentially at the two ends of the byte-values, e.g., moved from the second grouping 305 to the locations apart from one another in histogram 400. In an example embodiment, the separation of the byte-values is established based on the Hamming distance metric. Here the Hamming distance metric may be the number of different bits between two byte-values. The spread of the higher probability byte-values away from each other using mappings allows the present system and method to more easily distinguish between these values. This provides a lower probability of errors as mapped the most likely stored values (e.g., byte-values) to spread them from each other would require more bit flips to erroneously transform the stored errors into each other. That is, more errors are needed for the byte-values to be erroneously changed to another high occurrence byte value. Use of the Hamming distance metric will likely maximize the number of errors required to change a likely byte-value into an erroneous byte-value. Likewise, other byte-values that were members of groupings 304, 305 are spread apart in data file shown in the histogram 400 relative to their locations in the histogram 300. That is, the bytes in the data file of FIG. 3 are mapped to new locations in the mapped data file shown in FIG. 4. This mapping can occur prior to encoding the data file for saving in the non-volatile memory. The inverse can occur for decoding. The mapped, saved data is decoded, which takes advantage of the mapping to improve decoding. Then, the decoded data is un-mapped to generate the original data file. As stated above, the byte-values in FIG. 3 can be mapped to the byte-values of FIG. 4 using the Hamming distance metric to maximize the number of errors that must occur for a high occurrence byte-value to be erroneously changed to another high occurrence byte-value during read or write in a non-volatile memory.

Figure 5:
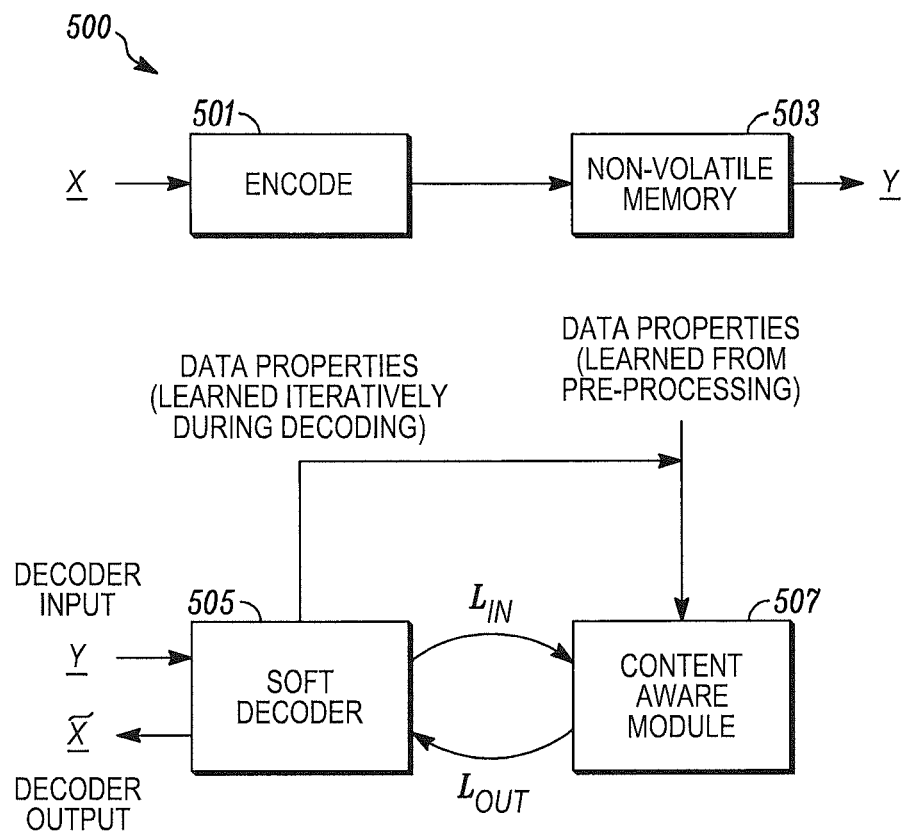
FIG. 5 is a schematic view of a decoding scheme for a memory system in an aspect of the present disclosure.

FIG. 5 shows an example embodiment of an encoder/decoder 500. The encode module 501 can receive a data file X. The encode module 501 sends the encoded data to the non-volatile memory 503 for storage. When a read command is received, the memory controller can command that the encoded data be read from the non-volatile memory 503 and output as data file Y. The data file Y is the input into the soft decoder 505. The soft decoder 505 processes the data file Y to output the data file X̂. The content aware module 507 outputs data characteristics $L_{out}$ to the soft decoder 505 to provide data characteristics that assist the soft controller 505 in decoding and error correction. The content aware module 507 receives data properties $L_{in}$ from the soft decoder 505. These data properties can be learned iteratively, e.g., based on the type of data being decoded in the soft decoder. The data properties can include structure of the data as described herein. The type of data can be a specified data type, e.g., text, music, video, still images (e.g., in RAW format), audio, or other data type.

Knowledge of the underlying characteristics of the data may help the decoder 505 in obtaining correct results when decoding data compared to conventional methods which do not use such methods. An example embodiment of the disclosure will be described such that knowing the underlying statistics or structure of the data assists the soft decoder 505 to produce decoded data that is correct. Referring to FIG. 2, it shows the text file 200 in ASCII format. Each character in ASCII is a byte 202 and all the most common characters only occupy the seven (7) least significant bits of the byte. If the ECC decoder, for example, understood that the data is shaped (e.g., structured) like presented on FIG. 2, the ECC decoder could alter the decoding parameters to reflect this data shape (changing the probability of the ones and zeros distribution in every byte's most significant bit) and thus improve performance and correction capability. Other data characteristics can be the distribution of "words" in the data file, which can be individual bytes of data. For example, the distribution of words, as byte values, are shown in FIGS. 3 and 4, as a data file and a mapped data file. This distribution data can be fed to the soft decoder 505 and used to create a map to transform the data before encoding, and use map bases data characteristics for decoding.

Figure 6:
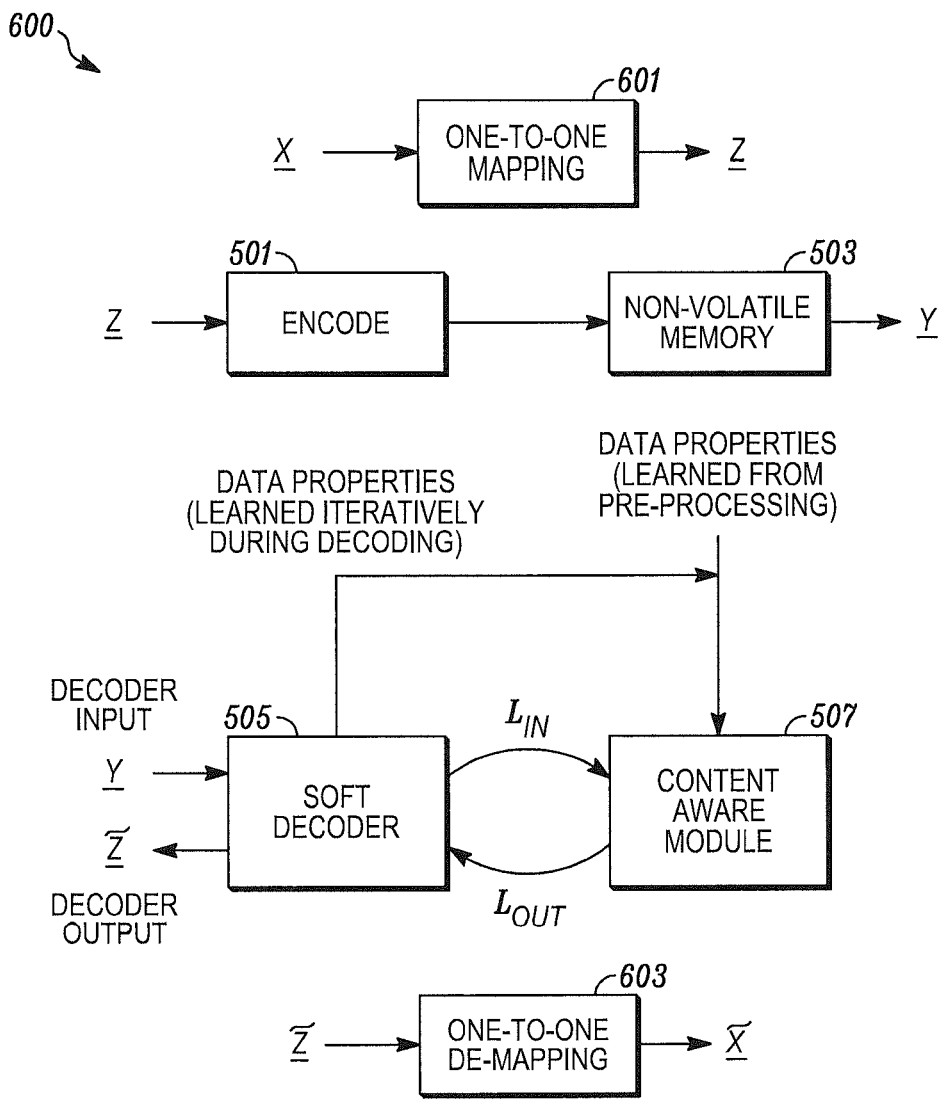
FIG. 6 is a byte histogram of a text file for use with the decoding scheme for a memory system in an aspect of the present disclosure.

FIG. 6 shows an example embodiment of an encoder/decoder system 600, which includes some of the same elements as the system 500. In the encoder/decoder system 600, the data file X is fed to a mapping module 601, which can map the data file X to a mapped data file Z. The mapped data file Z includes the same data as in the original data file X but is one-to-one mapped to data file Z. For example, the data behind the histogram 300 (data file X in this example) is mapped to the histogram 400 (data file Z in this example). In an example embodiment, the one-to-one mapping is an injective function that transform the data file X into data file Z in this example while preserving the distinctiveness of the data in the data file. The one-to-one basis is not a compression algorithm to reduce the size of the data, but conditions the data to improve decoding and error correction. In an example embodiment, the map defines a bijective function, i.e. f:X→Z. The distinctiveness is on an element basis, e.g., mapping of each element within the data file is to one element of the mapped data file.

In use of the encoder/decoder system 600 selects a one-to-one mapping function and applies it on data file X prior encoding. In order to increase the correction capability of this system, the system 600 searches for a one-to-one mapping such that the mutual information of the content aware module's output $L_{out}$ and the mapped data file Z is maximized. The following function can be used to select the map for type of data.

$$\text{Map} = \arg\max_{\substack{all\,one-to-one\\mappings\,X\to Z}} I(Z, L_{out})$$

In other words, the content aware decoder is more informative when the input data is the data file Z instead of using the original data file X. After the decoding by the soft decoder 505 and we get the output data file $\tilde{Z}$. The system 600 can implement the demapping module 603, e.g., applying the inverse of the map on the data file $\tilde{Z}$, in order to obtain $\tilde{X}$.

In order to perform the inverse transform on the decoded data $\tilde{Z}$ after a successful decoding in order to retrieve the original data file $\tilde{X}$, the system 600 stores the mapping function that was used in the mapping module 601 during the encoding phase for the data file.

There are many data files with the same or similar underlying statistics, the system 600 can use a same mapping for all cases where the underlying statistics are similar enough between data files or data file types. For example, the system 600 can use the same mapping for all text files. This way, by storing only a single map function for a text file, which can be represented as a table of 256 bytes in memory used by the controller. The map function for use in the mapping module 601 can map each input byte-value into an output byte-value. The system can apply this same mapping function to all text files that will be saved in the system. Likewise, a single image mapping function can be stored for image files, e.g., RAW image files. A single audio mapping function can be stored for audio files. Other file types can have an single, individual mapping function stored in the memory of the system.

To develop the maps, an offline analysis can be performed to learn the different data types and their corresponding underlying statistics and classify them into a finite set of classes. Each class can be assigned with its unique map. The system needs to store only a few maps, e.g., as mapping tables, in order to support all different data types. If a file type is not recognized the present nonvolatile memory system can use the encoder/decoder system 500 and not apply the map to the data file.

This procedure of classifying the data into classes and assigning each class a unique map, e.g., mapping table, can be also performed online and optimize the system such that the system will store the mappings that correspond to the most frequent classes.

Figure 7:
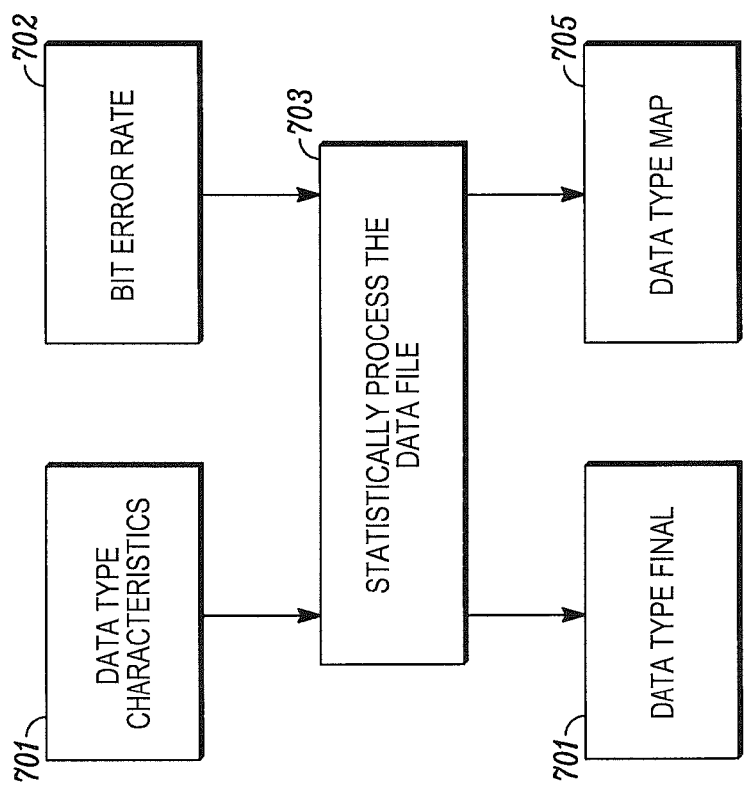
FIG. 7 is a method for decoding in a memory system in an aspect of the present disclosure.

FIG. 7 is a flow chart of a method 700 for generating a map and Lout according to an example embodiment. At 701 and 702, inputs are made to the step 703 for processing the file type. At 701, the data type characteristics for a specific data type is input. The data type characteristics are specific to a data type Referring back to FIG. 3, a statistical analysis of a text file reveals the histogram 300. It shows that some byte-values have a higher probability of occurrence than other byte-values. The present disclosure can use other statistical analysis of digital files that may result in different maps. This different maps can be used to map and un-map a data file according to the teachings herein At 702, a bit error rate is input. The bit error rate can be set based on known error rates in the type of nonvolatile memory. A bit error rate is the number of read bits from the non-volatile memory that have been altered due to noise, interference, or distortion to, from or in the memory cell.

At 703, the data file is statistically processed using the data type characteristics and the bit error rate to determine a data type final feedback value 704 and a map for the data type 705. The data type final value 704 can be the underlying data type statistics after the data is mapped. The map 705 is used to map the data before encoding to condition the data for encoding and decoding to reduce errors in the data read from the non-volatile memory.

Figure 8:
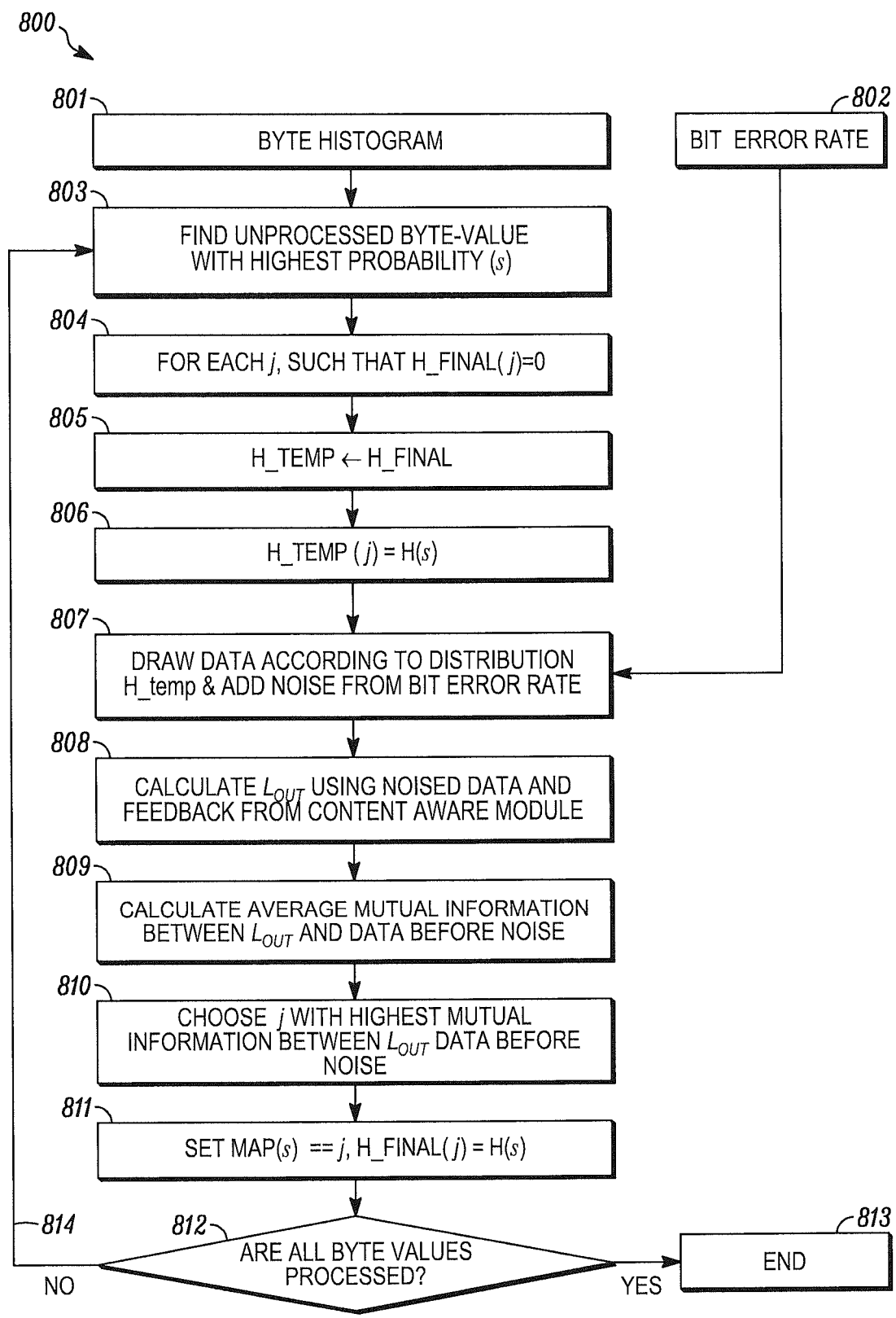
FIG. 8 is a method for decoding in a memory system in an aspect of the present disclosure.

FIG. 8 is a flow chart of a method 800 for optimizing the data mapping according to an example embodiment. The method 800 is a specific version of the method 700. For example, the method 800 can be used on text files that produce the byte histogram 300 of text files. However, the method 800 can be performed on other data types. The method 800 can be applied to the case where the underlying statistics that are tracked are K-bit histograms (e.g., dividing the data into K-tuples and calculate the distribution of each K-tuple) and not only byte-histograms. The byte-histogram is only a specific example that is related to FIG. 3 and FIG. 4. FIG. 8 describes a method for finding the mapping assuming the source statistics are K-bit histogram.

At 801, the byte histogram is provided. In an example embodiment, the byte histogram is byte histogram 300 (FIG. 3). The byte histogram is denoted by "H." At 802, the bit error rate is provided. The bit error rate is the probability of the nonvolatile memory producing a bit flip. The bit error rate can change over the lifetime of the memory.

At 803, the unprocessed byte value in the byte-histogram with the highest probability is found. The byte value is denoted by (s).

At 804, for each value j where H_final(j)=0 is empty the process continues. The present process is conducted for all locations of the map that are empty. For example, if there are two hundred fifty-six possible byte-values in the text file, then the process will run two hundred fifty-six times to provide the one-to-one map to translate the text data file from the histogram 300 to the histogram 400. H-final is set to all-zero when process 800 starts.

At 805, a temporary histogram, which is used for processing, H_temp, is assigned to be the previously computed histogram, H_final.

At 806, the histogram H_temp(j) is set to equal the histogram H(s). The histogram H(s) is the probability of the current histogram values.

At 807, draw data according to distribution of H_temp(j) and addition of the noise from the bit error rate 802. Drawing the data changes the data to include the noise.

At 808, the input $L_{out}$ to the soft decoder from the content aware module is calculated using the noised data and feedback from the content aware module. In an example embodiment, the value $L_{out}$ can be a vector with a length N, where N is the length of the codeword.

At 809, the mutual information between $L_{out}$ and the data before noise is calculated. In an example embodiment, the mutual information can be the average mutual information. This can be data file Z. This calculation can be done using empirical data regarding the bit in the Z vector, e.g., information from the content aware module for an individual bit.

At 810, the value j is chosen with the highest mutual information between $L_{out}$ and the data before noise.

At 811, the map (s) is set equal to j. The histogram H_final(j) is set to be histogram H(s).

At 812, the determination of whether all the byte values have been processed to produce the map. If yes, then the process ends at 813 with the H_final being set. If all byte-values have not been processed then the process follows 814 and returns to step 803.

Figure 9:
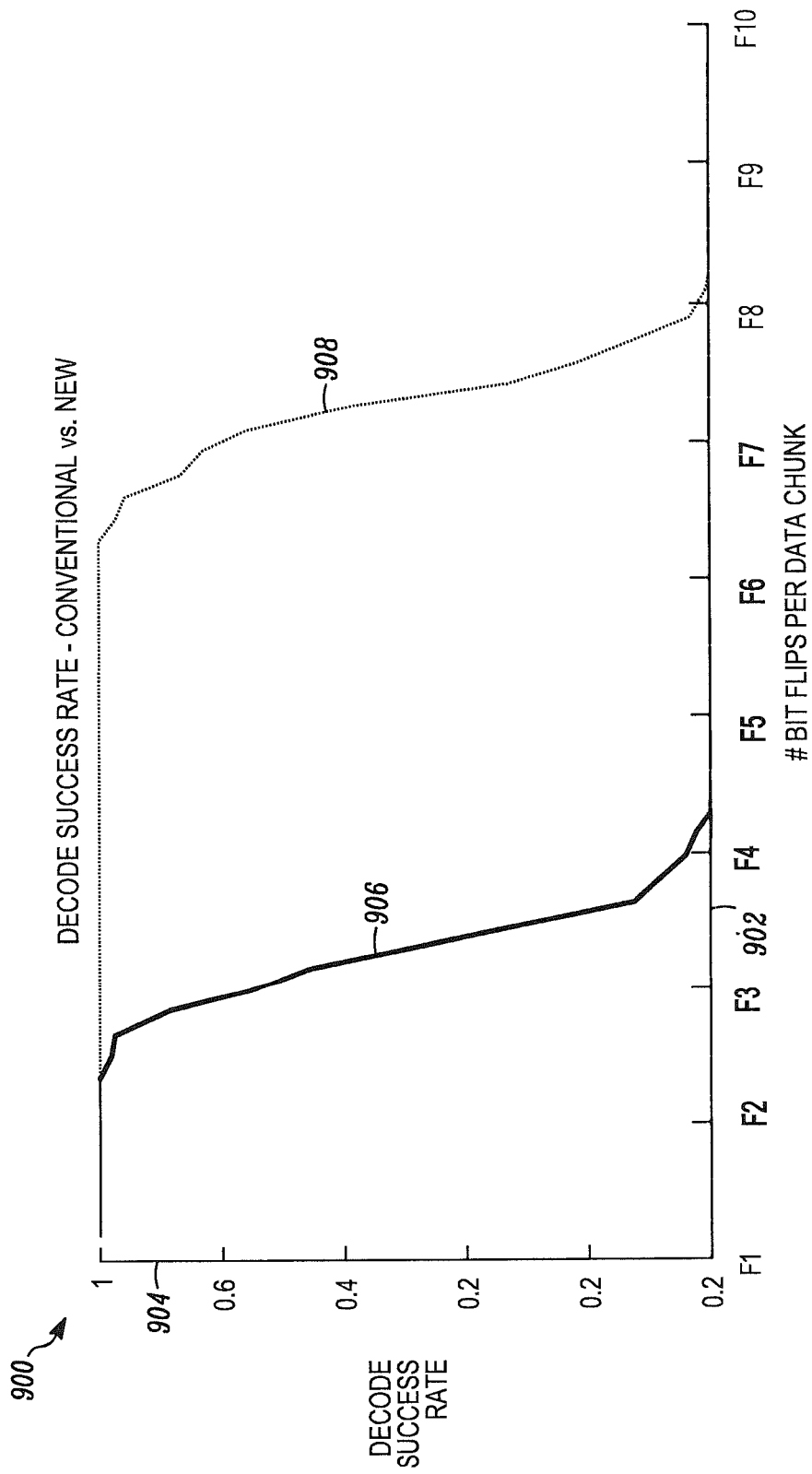
FIG. 9 shows a graph of the improvement of the present decoding methodology compared to a conventional process.

FIG. 9 is a schematic graph 900 of improved error correction using the methods and systems of the present disclosure relative to conventional methods. The graph 900 shows decode success rate versus the number of bit flips (F) in data chunks. The X-axis 902 corresponds to the number of bit flips in a data chunk. The Y-axis 904 corresponds to the decode success rate out of F1-F10 data chunks. The "lower" curve 906 corresponds to the default decoder, with content aware capabilities but without data mapping. The "upper" curve 908 utilizes the presently described structure or method(s) and corresponds to the content aware decoding methods. The data is mapped and the decoding uses the underlying statistics to decode and error correct the read data.

In this example, by using the mapping approach, the correction capability is increased, e.g., by about 40%

Figure 10:
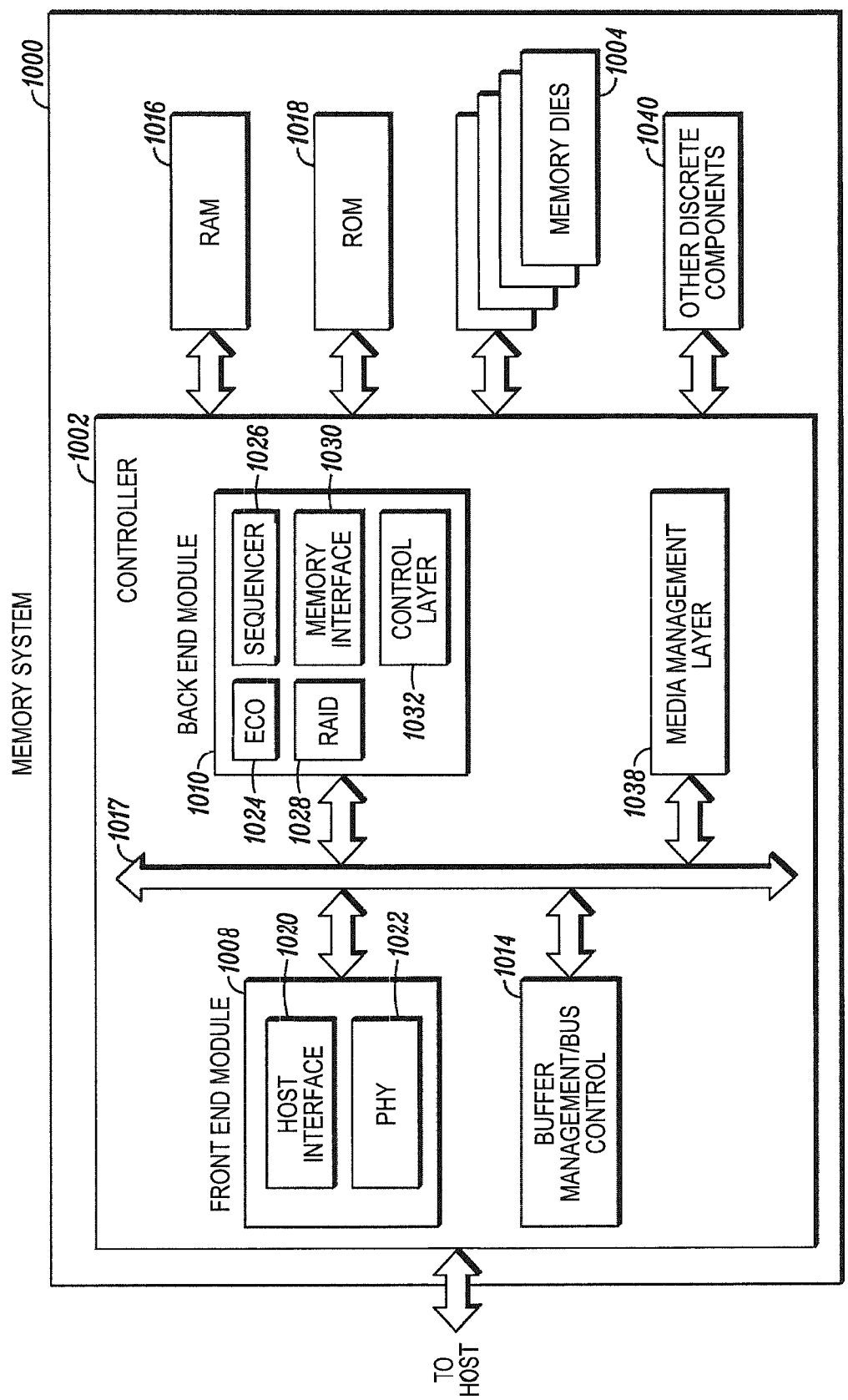
FIG. 10 shows an example non-volatile memory system in an aspect of the present disclosure.

FIG. 10 shows an example non-volatile memory system 1000 illustrating exemplary components of a non-volatile memory controller 1002. The controller 1002 may include a front end module 1008 that interfaces with a host, a back end module 1010 that interfaces with the non-volatile memory die(s) 1004, and various other modules that perform various functions of the non-volatile memory system 1000. In general, a module may be hardware or a combination of hardware and software, with the software dedicated to the hardware to cause the module to assist in the functioning of the non-volatile memory system 1000. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 1002 may include a buffer manager/bus controller module 1014 that manages buffers in random access memory (RAM) 1016 and controls the internal bus arbitration for communication on an internal communications bus 1017 of the controller 1002. A read only memory (ROM) 1018 may store and/or access system boot code. Although illustrated in FIG. 10 as located separately from the controller 1002, in other embodiments one or both of the RAM 1016 and the ROM 1018 may be located within the controller 1002. In yet other embodiments, portions of RAM 1016 and ROM 1018 may be located both within the controller 1002 and outside the controller 1002. Further, in some implementations, the controller 1002, the RAM 1016, and the ROM 1018 may be located on separate semiconductor dies. The ROM 1018 may store one or more the maps described herein for use by the controller 1002.

Additionally, or alternatively, the front-end module 1008 may include a host interface 1020 and a physical layer interface (PHY) 1022 that provide the electrical interface with the host or next level storage controller. The choice of the type of the host interface 1020 can depend on the type of memory being used. Example types of the host interface 1020 may include, but are not limited to, SATA, SATA Express, SAS, Fibre Channel, USB, PCIe, and NVMe. The host interface 1020 may typically facilitate transfer for data, control signals, and timing signals.

The back end module 1010 may include an error correction code (ECC) engine or module 1024 that encodes the data bytes received from the host, and decodes and error corrects the data bytes read from the non-volatile memory die(s) 1004. The backend module 1010 also include a command sequencer 1026 that generates command sequences, such as program, read, and erase command sequences, to be transmitted to the non-volatile memory die(s) 1004. Additionally, or alternatively, the back end module 1010 may include a RAID (Redundant Array of Independent Drives) module 1028 that manages generation of RAID parity and recovery of failed data. The RAID parity may be used as an additional level of integrity protection for the data being written into the non-volatile memory system 100. In some cases, the RAID module 1028 may be a part of the ECC engine 1024. A memory interface 1030 provides the command sequences to the non-volatile memory die(s) 1004 and receives status information from the nonvolatile memory die(s) 1004. Along with the command sequences and status information, data to be programmed into and read from the non-volatile memory die(s) 1004 may be communicated through the memory interface 130. In one embodiment, the memory interface 1030 may be a double data rate (DDR) interface and/or a Toggle Mode 200, 400, 800, or higher interface. A control layer 1032 may control the overall operation of back end module 1010. The backend module 1010 may store the maps and operate to transform the data with the map in a bijection process before encoding for storage on the dies 1004. The storage cells on dies may be a source of bit errors that the present disclosure accounts for during the storage of the data files in the memory cells.

Additional modules of the non-volatile memory system 1000 illustrated in FIG. 10 may include a media management layer 1038 that performs certain memory management functions such as wear leveling of memory cells of the memory dies 1004, address management, and facilitates folding operations. Other memory management functions may be possible. Wear of the individual memory cells can be another source of bit errors that the present disclosure can address. The non-volatile memory system 1000 may also include other discrete components 1040, such as external electrical interfaces, external RAM, resistors, capacitors, or other components that may interface with the controller 1002. In alternative embodiments, one or more of the RAID module 1028, media management layer 1038 and buffer management/bus controller 1014 are optional components that may not be necessary in the controller 1002.

In some embodiments, the present disclosure describes methods and systems that a method that can increase correction capability and reduce the decoding latency and power consumption by conditioning the data to be stored in a non-volatile memory using map transformation of the data. The map can transform the data on a one-to-one basis. The methods and systems can apply the map transformation on the data prior encoding such that the encoded data is more robust to noise in the memory storage. The mapping can distribute the data to improve encoding and decoding. Additionally, the decoder may be capable to decode larger number of bit flips. It is believed that some embodiments described herein can improve the error correction capability by more than 10%, 20% or in some cases 40%. The decoded, error-corrected data is then un-mapped to output the original data.

It is intended that the foregoing detailed description be understood as an illustration of selected forms that the invention can take and not as a definition of the invention. It is only the following claims, including all equivalents that are intended to define the scope of the claimed invention. It is contemplated that elements disclosed in one embodiment may be beneficially utilized on other embodiments without specific recitation. It should be noted that any aspect of any of the preferred embodiments described herein can be used alone or in combination with one another.

What is claimed is:

1. A method for decoding data, comprising:
   receiving, from a non-volatile memory, an encoded, mapped data file comprising an original data file mapped via a one-to-one mapping based on a characteristic of a data type of the original data file, and encoded;
   decoding the encoded, mapped data file with a soft decoder and thereby obtaining a mapped data file;
   de-mapping the mapped data file based on the characteristic of the data type of the original data file and thereby obtaining a recreation of the original data file; and
   outputting the recreation of the original data file,
   wherein the characteristic of the data type is one of a structure of the data type and a pattern of the data type.

2. The method of claim 1, wherein:
   the characteristic of the data type is an inherent redundancy of the data type; and
   the de-mapping comprises reversing a transformation of the original data file that was mapped based on the inherent redundancy of the data type.

3. The method of claim 2, wherein the de-mapping further comprises reversing the transformation of the original data file according to a probability of a data value to occur in the data type.

4. The method of claim 1, wherein the decoding comprises transmitting learned information $L_{in}$ from the soft decoder to a content aware module, and transmitting information $L_{out}$ from the content aware module to the soft decoder.

5. The method of claim 4, wherein the decoding further comprises the content aware module processing $L_{in}$ and additional information about the original data file to produce $L_{out}$, wherein the additional information about the original data file is at least one of: information received from an offline source and information learned from a current estimation of the original data file.

6. The method of claim 1, wherein the a size of the mapped data file and a size of the original data file are equal.

7. The method of claim 6, the characteristic of the data type of the original data file is common to all data files of the data type.

8. A method, comprising:
   mapping an original data file using a one-to-one mapping based on a characteristic of a data type of the original data file, thereby obtaining a mapped data file;
   encoding the mapped data file, thereby obtaining an encoded, mapped data file;
   storing the encoded, mapped data file in a non-volatile memory;
   reading the encoded, mapped data file;
   decoding the encoded, mapped data file using error correction, thereby obtaining a decoded, mapped data file; and
   de-mapping the decoded, mapped data file, thereby obtaining a recreation of the original data file;
   wherein the characteristic of the data type is one of a structure of the data type and a pattern of the data type.

9. The method of claim 8, further comprising:
   determining the one-to-one mapping based on an improvement in error correction of the decoding the encoded, mapped data file.

10. The method of claim 8, further comprising:
    determining the one-to-one mapping using an iterative process in which each iterative step improves improves mutual information of a content aware module's output ($L_{out}$) and the mapped data file.

11. The method of claim 8, wherein:
    the original data set is a non-uniformly distributed data set;
    the mapping comprises: performing in a processor:
       creating estimated data according to a distribution of a temporary underlying statistic based on a probable noise in the non-volatile memory;
       calculating information $L_{out}$ based on the estimated data and feedback from a content aware module;
       calculating mutual information between $L_{out}$ and the original data file before noise;
       choosing a highest mutual information between $L_{out}$ and the original data file before noise; and
       setting, as a map to be used to map the original data file, a map with a highest mutual information.

12. The method of claim 8,
    wherein the original data file is a text file; and
    wherein the mapping comprises: performing in a processor:
       creating estimated data according to a distribution of a temporary underlying statistic based on a probable noise in the non-volatile memory;
       calculating information $L_{out}$ based on the estimated data and feedback from a content aware module;
       calculating mutual information between $L_{out}$ and the original data file before noise;

choosing a highest mutual information between $L_{out}$ and the original data file before noise; and setting, as a map to be used to map the original data file, a map with a highest mutual information.

13. A memory controller for non-volatile memory, comprising:

a controller memory storing a plurality of data maps; and a processor operatively coupled with the controller memory and configured to:

determine a data type of an original data file to be stored in nonvolatile memory based on a characteristic of the original data file;

select, from the plurality of data maps, a data map corresponding to the data type of the original data file;

map the original data file using the data map corresponding to the data type, thereby obtaining a mapped data file;

encode the mapped data file, thereby obtaining an encoded, mapped data file; and store the encoded, mapped data file in the non-volatile memory;

wherein the characteristic of the original data file is one of a structure of the original data file and a pattern of the original data file.

14. The memory controller of claim 13, wherein the processor is further configured to map a bijection of the original data file.

15. The memory controller of claim 13, wherein the processor is further configured to: read the encoded, mapped data file from the non-volatile memory, decode, with a soft decoder, the encoded, mapped data file using an iterative content aware module, thereby obtaining the mapped data file, and de-map the decoded, mapped data file set using the data map corresponding to the data type, thereby obtaining a recreation of the original data file.

16. The memory controller of claim 15, wherein the processor is further configured to feedback data characteristics learned from the soft decoder to the content aware module and, using the content aware module, process historical data characteristics for the data type with the feedback data characteristics.

17. The memory controller of claim 16, wherein a size of the mapped data file and a size of the original data file are equal.

18. The memory controller of claim 13, wherein each of the plurality of data maps is a data table that transforms each input byte of the original data file into an output byte of the mapped data file.

19. The memory controller of claim 18, wherein the processor is further configured to store, in memory, the data type of the original data file, and select the data map corresponding to the data type using the stored data type.

* * * * *